United States Patent
Kachare et al.

(10) Patent No.: US 10,585,749 B2
(45) Date of Patent: Mar. 10, 2020

(54) SYSTEM AND METHOD FOR DISTRIBUTED ERASURE CODING

(71) Applicant: Samsung Electronics Co., Ltd., Suwon-si, Gyeonggi-do (KR)

(72) Inventors: Ramdas P. Kachare, Cupertino, CA (US); Fred Worley, San Jose, CA (US); Stephen Fischer, Mountain View, CA (US); Oscar Pinto, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 119 days.

(21) Appl. No.: 15/789,884

(22) Filed: Oct. 20, 2017

(65) Prior Publication Data
US 2019/0050289 A1    Feb. 14, 2019

Related U.S. Application Data

(60) Provisional application No. 62/543,789, filed on Aug. 10, 2017.

(51) Int. Cl.
*G06F 11/10* (2006.01)
*H03M 13/15* (2006.01)

(52) U.S. Cl.
CPC ....... *G06F 11/1076* (2013.01); *H03M 13/154* (2013.01)

(58) Field of Classification Search
CPC ................. G06F 11/1076; H03M 13/154
See application file for complete search history.

(56) References Cited

U.S. PATENT DOCUMENTS

| | | | |
|---|---|---|---|
| 5,574,736 A * | 11/1996 | Bandy | G06F 11/1076 711/113 |
| 8,321,597 B2 | 11/2012 | Yu et al. | |
| 8,856,431 B2 | 10/2014 | Chen et al. | |
| 9,384,093 B1 | 7/2016 | Aiello | |
| 9,521,201 B2 | 12/2016 | Ori | |
| 9,569,320 B2 | 2/2017 | Werner et al. | |
| 9,582,431 B2 | 2/2017 | Cohen | |
| 9,678,665 B2 | 6/2017 | Karamcheti et al. | |
| 2007/0150652 A1* | 6/2007 | Mochizuki | G06F 11/1076 711/114 |
| 2008/0109616 A1* | 5/2008 | Taylor | G06F 3/0611 711/155 |
| 2009/0044043 A1* | 2/2009 | Cherian | G06F 11/1092 714/6.12 |
| 2013/0097471 A1* | 4/2013 | Jeddeloh | G06F 11/1044 714/763 |
| 2017/0068488 A1 | 3/2017 | Shibatani et al. | |
| 2017/0147209 A1 | 5/2017 | Lee et al. | |

\* cited by examiner

*Primary Examiner* — Guy J Lamarre
(74) *Attorney, Agent, or Firm* — Lewis Roca Rothgerber Christie LLP

(57) ABSTRACT

A system and method for distributed erasure coding. A plurality of storage devices is directly connected to one or more host computers, without an intervening central controller distributing data to the storage devices and providing data protection. Parity codes are stored in one or more dedicated storage devices or distributed over a plurality of the storage devices. When a storage device receives a write command, it calculates a partial parity code, and, if the parity code for the data being written is on another storage device, sends the partial parity code to the other storage device, which updates the parity code using the partial parity code.

27 Claims, 14 Drawing Sheets

SYSTEM AND METHOD FOR DISTRIBUTED ERASURE CODING

CROSS-REFERENCE TO RELATED APPLICATION(S)

The present application claims priority to and the benefit of U.S. Provisional Application No. 62/543,789, filed Aug. 10, 2017, entitled "METHOD FOR DISTRIBUTED ERASURE CODING AND RAID CONFIGURATIONS IN NVME-OF ETHERNET SSD", the entire content of which is incorporated herein by reference.

FIELD

One or more aspects of embodiments according to the present invention relate to data storage, and more particularly to a system and method of distributed erasure coding.

BACKGROUND

Redundant data storage systems may distribute data across a plurality of storage devices that may be referred to as a redundant array of independent disks (RAID). The RAID array may be controlled by a central controller referred to as a RAID controller, which receives write commands, generates parity codes, stores the data to be written on the RAID array, along with the parity codes. In the event of data loss, the RAID controller may regenerate the lost data from the parity codes.

In such a system, the RAID controller may be costly, and may act as a bottleneck, reducing efficiency.

SUMMARY

Aspects of embodiments of the present disclosure are directed toward a system and method for distributed erasure coding. A plurality of storage devices is directly connected to one or more host computers, without an intervening central controller distributing data to the storage devices and providing data protection. Parity codes are stored in one or more dedicated storage devices or distributed over a plurality of the storage devices. When a storage device receives a write command, it calculates a partial parity code, and, if the parity code for the data being written is on another storage device, sends the partial parity code to the other storage device, which updates the parity code using the partial parity code.

According to an embodiment of the present invention there is provided a method for storing data in an array of storage devices, the method including: receiving, by a first storage device of the array of storage devices, a write command from a host computer, the write command including write data to be written to the first storage device at a logical block address in the first storage device; retrieving by the first storage device, old data stored at the logical block address; calculating, by the first storage device, from the old data and the write data, a partial parity code, the partial parity code being a number that: when evaluated, together with an old parity code, the old parity code being a data protection code for an old virtual stripe of data including the old data and extending across all of the array of storage devices, results in a new parity code, the new parity code being a data protection code for a new virtual stripe of data extending across all of the array of storage devices and including the write data instead of the old data; evaluating, by a second storage device of the array of storage devices, the old parity code together with the partial parity code, to generate the new parity code; and storing, by a third storage device of the array of storage devices, the new parity code.

In one embodiment, the third storage device is the second storage device.

In one embodiment, the method includes: calculating, by the first storage device, an identifier of the second storage device; determining whether the identifier of the second storage device is different from an identifier of the first storage device; and when the identifier of the second storage device is different from the identifier of the first storage device, sending, to the second storage device, a parity message including the partial parity code.

In one embodiment, the write command further includes a namespace identifier, and the calculating of the identifier of the second storage device includes: obtaining a namespace offset from a namespace offset table based on the namespace identifier; and calculating a virtual stripe identifier as the sum of the namespace offset and the logical block address.

In one embodiment, the calculating of the identifier of the second storage device includes: retrieving, by the first storage device, from a first table in the first storage device, a stride size; and calculating: the virtual stripe identifier modulo the stride size.

In one embodiment, the sending, to the second storage device, of the parity message includes: retrieving, by the first storage device, from a second table in the first storage device, an address of the second storage device; and sending the parity message to the address of the second storage device.

In one embodiment, the first storage device is an Ethernet storage device; the second storage device is an Ethernet storage device; and the address of the second storage device is an Ethernet address of the second storage device.

In one embodiment, the method includes storing, by a storage system management circuit, the address of the second storage device in the second table in the first storage device.

In one embodiment, the method includes storing, by the storage system management circuit, the stride size in the first table.

In one embodiment, the first storage device is connected to a peripheral component interconnect express switch; the second storage device is connected to the peripheral component interconnect express switch; and the address of the second storage device is a peripheral component interconnect express address of the second storage device.

In one embodiment, each of the old parity code and the new parity code is a data protection code utilized in a data protection system selected from the group consisting of RAID 4, RAID 5, RAID 6, and erasure code data protection systems.

In one embodiment, the method includes, upon failure or disconnection of the first storage device, reconfiguring, by a storage system management circuit, the storage interface switch to route storage commands addressed to the first storage device to the storage system management circuit; and sending, in response to a received storage command, by the storage system management circuit, the same command completion, through the storage interface switch, as the first storage device would have sent were it present and operating correctly.

In one embodiment, the method includes, recovering, by the storage system management circuit, data previously stored on the first storage device; and storing the recovered data on a second storage device.

In one embodiment, the method includes, upon failure or disconnection of the first storage device, reconfiguring, by a storage system management circuit, the storage interface switch to route storage commands addressed to the first storage device to a second storage device; and sending, in response to a received storage command, by the second storage device, the same command completion, through the storage interface switch, as the first storage device would have sent were it present and operating correctly.

In one embodiment, the method includes, upon occurrence of a discrete failure in the first storage device and receipt of a read command, recovering data affected by the discrete failure, by the first storage device; and sending, in response to the read command, by the first storage device, the same command completion, through the storage interface switch, as the first storage device would have sent had the discrete failure not occurred.

In one embodiment, the method includes, upon occurrence of a discrete failure in the first storage device and receipt of a read command, recovering data affected by the discrete failure, by a storage system management circuit; and sending, in response to the read command, by the storage system management circuit, the same command completion, through the storage interface switch, as the first storage device would have sent had the discrete failure not occurred.

According to an embodiment of the present invention there is provided a system for storing data, including an array of storage devices, the system being configured to: receive, by a first storage device of the array of storage devices, a write command from a host computer, the write command including write data to be written to the first storage device at a logical block address in the first storage device; retrieve by the first storage device, old data stored at the logical block address; calculate, by the first storage device, from the old data and the write data, a partial parity code, the partial parity code being a number that: when evaluated, together with an old parity code, the old parity code being a data protection code for an old virtual stripe of data including the old data and extending across all of the array of storage devices, results in a new parity code, the new parity code being a data protection code for a new virtual stripe of data extending across all of the array of storage devices and including the write data instead of the old data; evaluate, by a second storage device of the array of storage devices, the old parity code together with the partial parity code, to generate the new parity code; and store, by a third storage device of the array of storage devices, the new parity code.

In one embodiment, the third storage device is the second storage device.

In one embodiment, the system includes the partial parity code.

In one embodiment, the calculating of the identifier of the second storage device includes: retrieving, by the first storage device, from a first table in the first storage device, a stride size; and calculating: the logical block address modulo the stride size.

In one embodiment, the sending, to the second storage device, of the parity message includes: retrieving, by the first storage device, from a second table in the first storage device, an address of the second storage device; and sending the parity message to the address of the second storage device.

In one embodiment, the first storage device is an Ethernet storage device; the second storage device is an Ethernet storage device; and the address of the second storage device is an Ethernet address of the second storage device.

In one embodiment, the system includes a storage system management circuit configured to store the address of the second storage device in the second table in the first storage device.

In one embodiment, the first storage device is connected to a peripheral component interconnect express switch; the second storage device is connected to the peripheral component interconnect express switch; and the address of the second storage device is a peripheral component interconnect express address of the second storage device.

In one embodiment, each of the old parity code and the new parity code is a data protection code utilized in a data protection system selected from the group consisting of RAID 4, RAID 5, RAID 6, and erasure code data protection systems.

According to an embodiment of the present invention there is provided a system for storing data, including: an array of storage devices; and storage system management means, the system being configured to: receive, by a first storage device of the array of storage devices, a write command from a host computer, the write command including write data to be written to the first storage device at a logical block address in the first storage device; retrieve by the first storage device, old data stored at the logical block address; calculate, by the first storage device, from the old data and the write data, a partial parity code, the partial parity code being a number that: when evaluated, together with an old parity code, the old parity code being a data protection code for an old virtual stripe of data including the old data and extending across all of the array of storage devices, results in a new parity code, the new parity code being a data protection code for a new virtual stripe of data extending across all of the array of storage devices and including the write data instead of the old data; evaluate, by a second storage device of the array of storage devices, the old parity code together with the partial parity code, to generate the new parity code; and store, by a third storage device of the array of storage devices, the new parity code.

In one embodiment, the storage system management means is configured to store, in each of the storage devices, an address of another storage device.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a system and method for distributed erasure coding provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
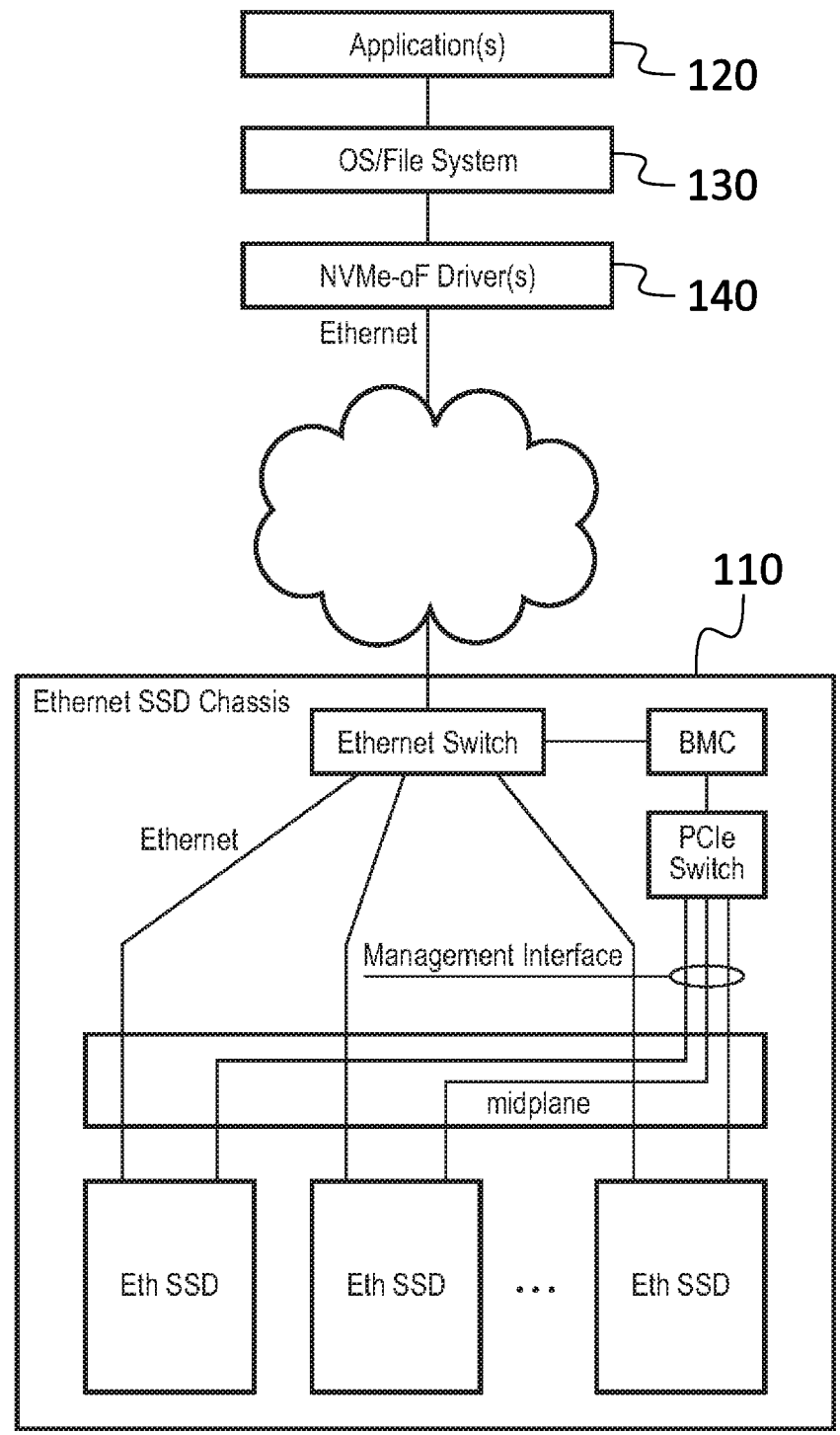
FIG. 1 is a schematic drawing of a storage system, according to an embodiment of the present invention.

Referring to FIG. 1, in some embodiments, a storage system implemented in an Ethernet solid state drive (Ethernet SSD) chassis 110 includes an array (i.e., a plurality) of (e.g., 24 or 48) Ethernet SSDs, each connected to a storage interface switch, e.g., an Ethernet switch. Each of the Ethernet SSDs may be connected to storage system management circuit (which may be a processing circuit, as described in further detail below), such as a baseboard management controller (BMC). The Ethernet SSDs may be connected to the baseboard management controller through a midplane and a peripheral component interconnect express (PCIe) switch. The Ethernet SSDs may be connected in a remote direct attached storage (DAS) configuration, each Ethernet SSD being independent of the other Ethernet SSDs for 10 operations. In this configuration, the potential bottleneck of a RAID controller may be avoided. Moreover, the system of FIG. 1 is capable, in principle, of accommodating a large number of Ethernet SSDs (e.g., 256 Ethernet SSDs).

Each Ethernet SSD may include nonvolatile memory (e.g., flash memory), a buffer, and a controller, which may be a processing circuit, as discussed in further detail below. The controller may interface to a host computer and perform all functions of the Ethernet SSD except for the storage of data, which may be performed by the buffer and the nonvolatile memory. The buffer may be volatile memory. As used herein, a "storage interface switch" is a switch that allows the host computer to interact with each of the Ethernet SSDs, exchanging, for example, commands and command completions with the Ethernet SSDs.

An application 120 (of which there may be several) may interact with the storage system through the file system 130 of the operating system of a host computer on which the application is executing, and through an Nonvolatile Memory Express (NVMe) over Fabrics (NVMe-oF) driver instantiated on the host. The host may be agnostic to the chassis-level data protection provided by the storage system (e.g., the implementation of data protection may be hidden from the host, which may perceive only a reliable storage system, that may have varying performance (e.g., the performance being reduced when data recovery operations are taking place). A separate driver may be instantiated on the host for each Ethernet SSD; the driver instance 140 may "own" the Ethernet SSD in the sense that all access to the Ethernet SSD may be through the respective driver instance 140, and in the sense that there may be a one-to-one relationship between driver instances 140 on the host and Ethernet SSDs in the system. Each Ethernet SSD may have its own namespaces. The storage system may be configured to implement any of various protection modes, including RAID 4, RAID 5, RAID 6, and Erasure Coding (or "erasure code data protection").

Figure 2A:
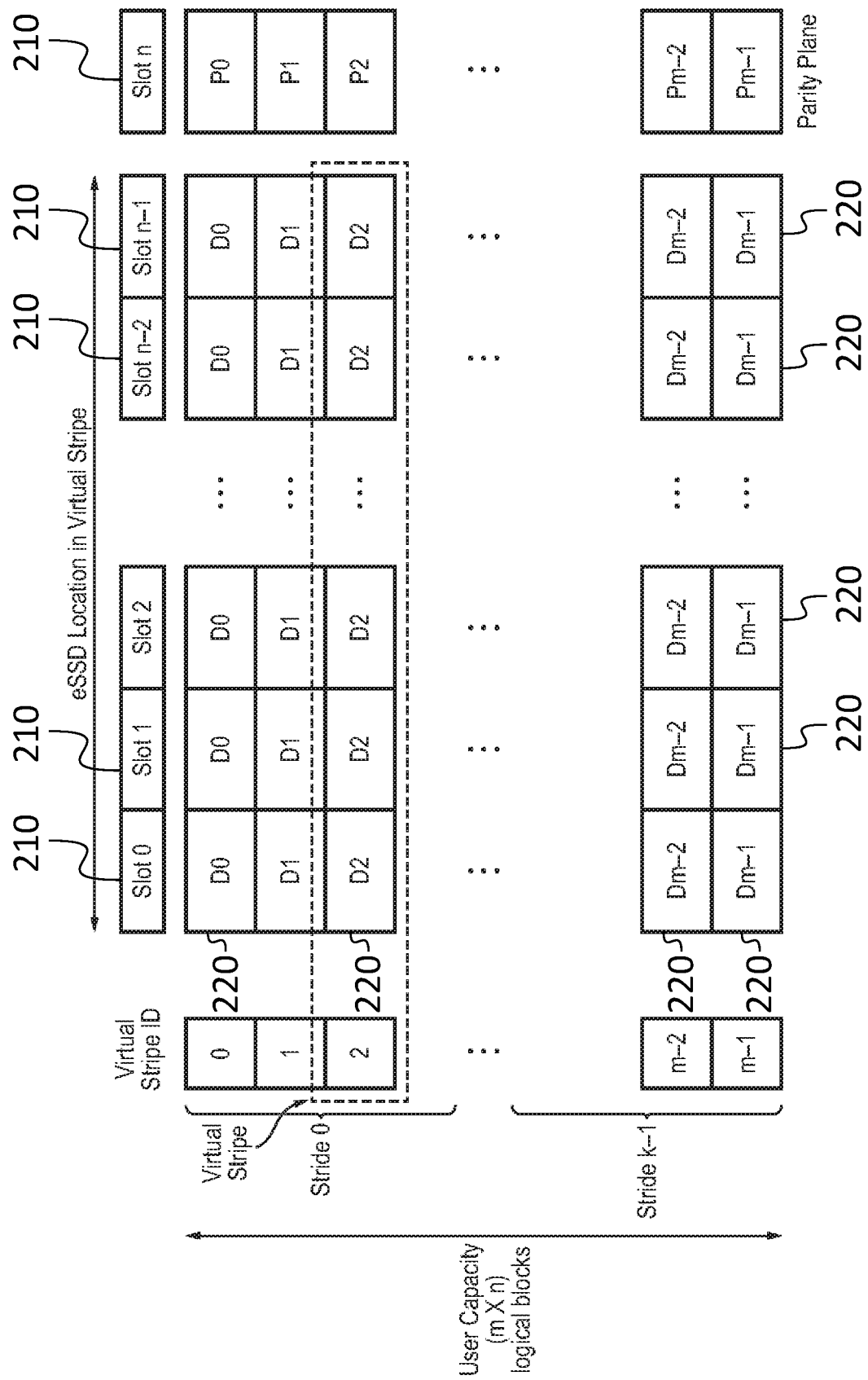
FIG. 2A is a data and parity layout diagram for a protection group, according to an embodiment of the present invention.
Figure 2B:
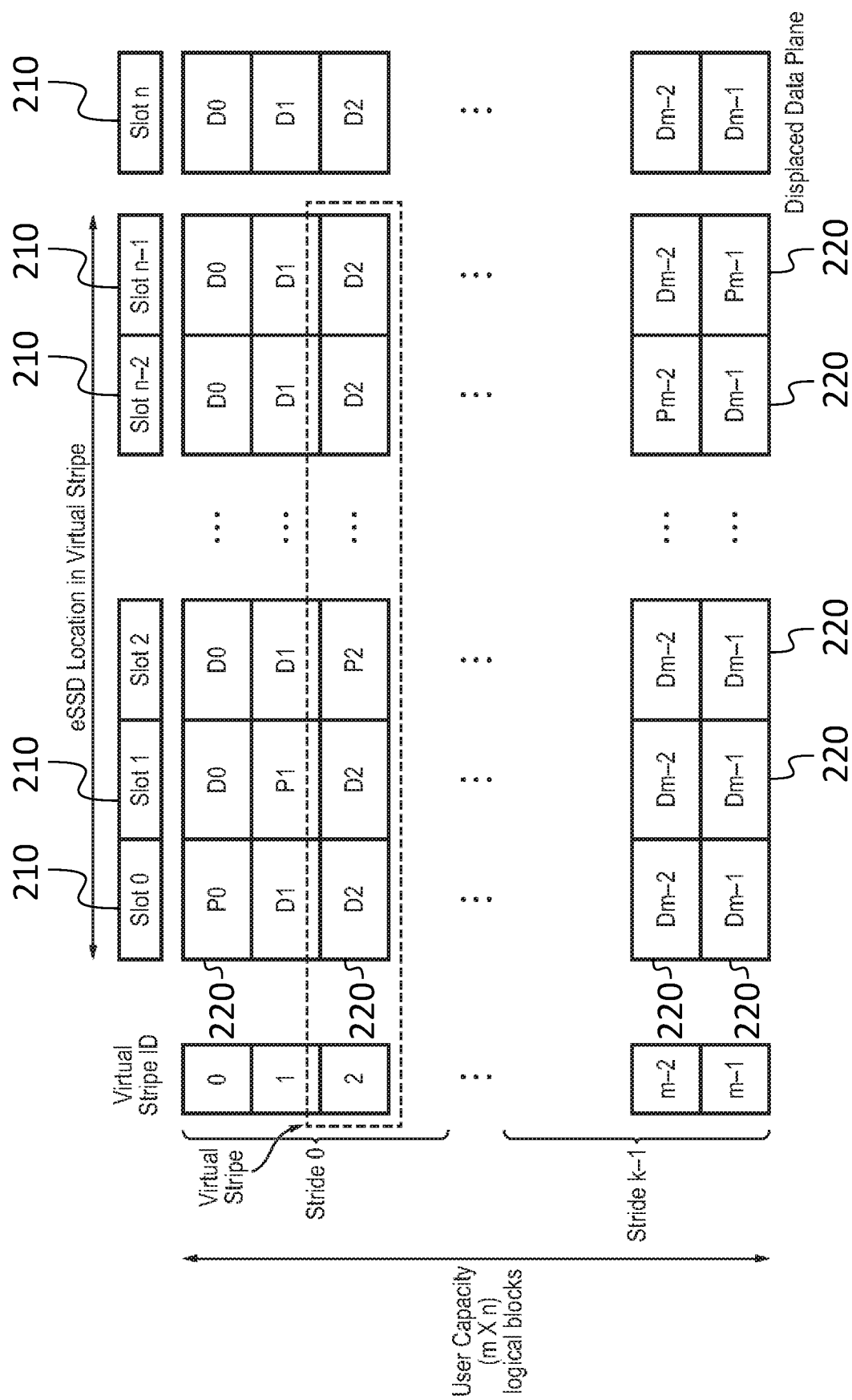
FIG. 2B is a data and parity layout diagram for a protection group, according to an embodiment of the present invention.

Referring to FIGS. 2A and 2B, the data protection system may protect units of data referred to herein as "virtual stripes". Each virtual stripe is assigned a number or "identifier". Each virtual stripe includes data and parity codes. As used herein, a "parity code" is redundant data stored along with data, from which the data may be recovered in the event of an error or erasure in the stored data (including, for example, the loss of stored data resulting from a failed Ethernet SSD). Each virtual stripe is distributed across a plurality of Ethernet SSDs so that the failure of any one Ethernet SSD does not result in an irrecoverable loss of data.

In the embodiment of FIGS. 2A and 2B, n+1 Ethernet SSDs are part of a protection group, and they are installed in slots 210 (in the Ethernet SSD chassis 110) numbered 0 through n as shown. The storage system (and/or the Ethernet SSD chassis 110) may include one or more protection groups. Each Ethernet SSD provides storage in units of blocks 220, each block 220 being represented by a respective rectangle in FIGS. 2A and 2B. The sizes of the blocks 220 may be programmable; each block 220 may, for example, consist of 512 bytes, 1024 bytes, or 4096 bytes. Each virtual stripe may include one block 220 from each of the Ethernet SSDs, with, e.g., virtual stripe 0 including block D0 from the Ethernet SSD in slot 0, block D0 from the Ethernet SSD in slot 1, and so forth, and with (as illustrated) virtual stripe 2 including block D2 from the Ethernet SSD in slot 0, block D2 from the Ethernet SSD in slot 1, and so forth.

The parity data (P0, P1, etc.) may be stored in an Ethernet SSD in slot n as shown in FIG. 2A (in an arrangement that may be referred to as "fixed parity"), or, as shown in FIG. 2B, the parity data may be stored (in an arrangement that may be referred to as "rotating parity") in a slot and block 220 that rotates through the Ethernet SSDs. In the rotating parity arrangement, the Ethernet SSD in slot n may act as a displaced data plane and store the data that is "displaced" as a result of the Ethernet SSD that ordinarily would have stored that data storing instead a block 220 of parity codes. The virtual stripes may be grouped into groups referred to as "strides". The size of each stride may be n, and the location of the parity data, in a rotating parity arrangement, may repeat with each additional stride (e.g., parity data may be in the second drive (in slot 1) both in the second virtual stripe (virtual stripe 1) of stride 0 and in the second virtual stripe (virtual stripe n+1) of stride 1).

The responsibility for calculating and updating parity codes when new data are written may be distributed among the SSDs, e.g., in a rotating arrangement that may, if rotating parity is employed, coincide with the storage of parity data (and, if fixed parity is employed, the responsibility may be arranged in the same rotating arrangement, while parity data are stored in the parity plane). For example, if rotating parity is employed, the Ethernet SSD in slot 2 may be responsible for (i) updating parity data P2 and (ii) storing parity data P2; if fixed parity is employed, the Ethernet SSD in slot 2 may be responsible for updating parity data P2 and the Ethernet SSD in slot n (the parity plane) may be responsible for storing parity data P2. The Ethernet SSD that is responsible for calculating and updating parity codes for any stripe may be referred to as the "DIP Ethernet SSD" or the "D/P eSSD" for the stripe. The identifier (or slot number) of the Ethernet SSD that is responsible for calculating and updating parity codes may be calculated, for any virtual stripe, as (the virtual stripe identifier) modulo (the stride size (n)).

Figure 3:
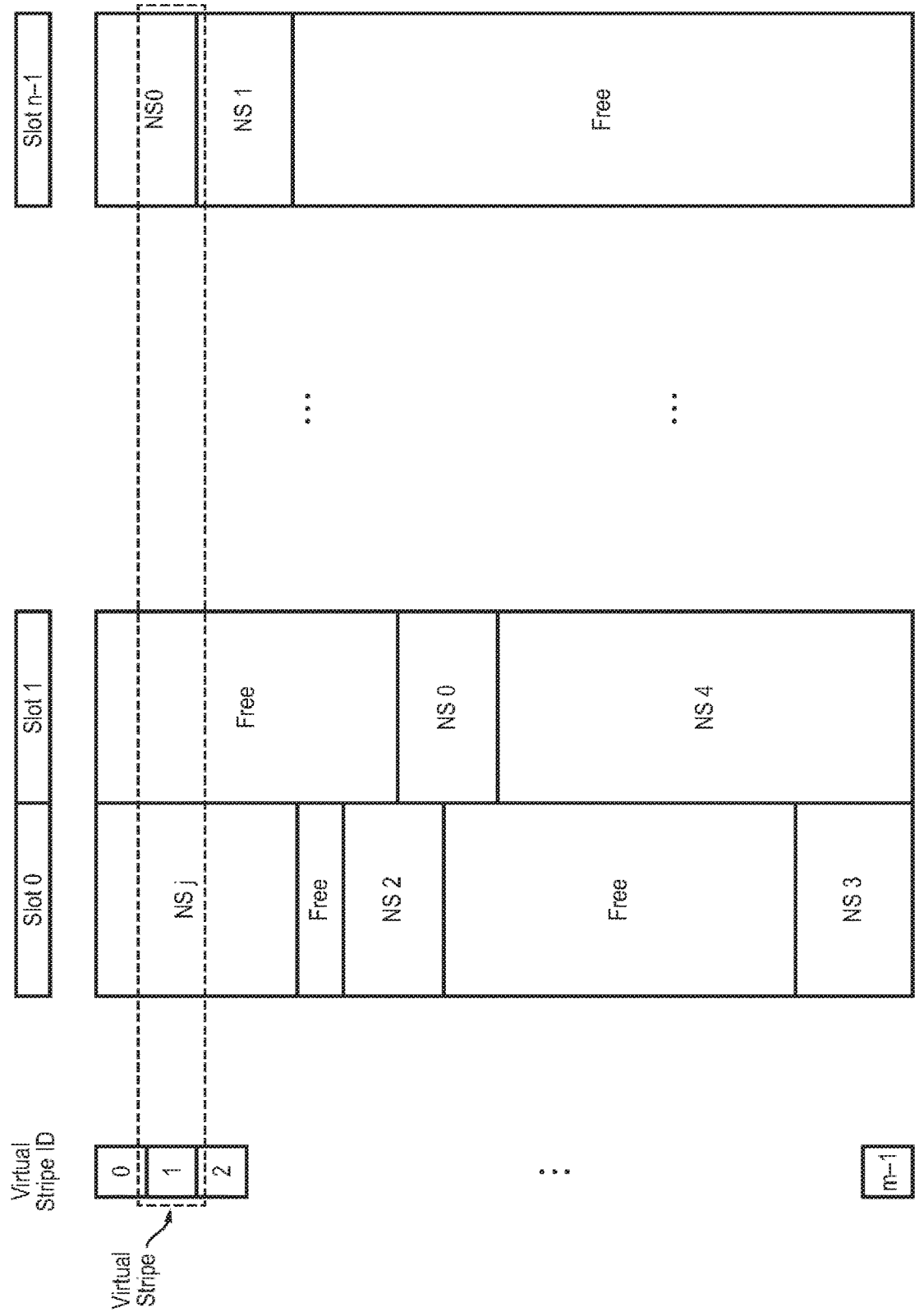
FIG. 3 is a storage map of a storage system, according to an embodiment of the present invention.

Referring to FIG. 3, each of the Ethernet SSDs may host one or more namespaces (labeled "NS0", "NS1", etc. in FIG. 3). Each name space may be associated, in a namespace offset table, with an offset that determines the location within the Ethernet SSD at which the namespace begins. When a write operation to a namespace is performed, the Ethernet SSDs hosting the namespace may calculate the virtual stripe within which the write is to be performed by adding the logical block address (LBA) of the write operation to the namespace offset.

When data within a virtual stripe is modified (e.g., as the result of executing a write command including data to be written, or "write data"), the parity code for the virtual stripe may be recalculated as follows. Each parity code may be a function of all of the data in the virtual stripe. For example, the parity code P may be the bit-wise exclusive OR of all the data in the virtual stripe:

$$P = D_0 + D_1 + D_2 + \ldots + D_{n-1}$$

where "+" represents the bit-wise exclusive OR operation and $D_i$ are the data. If one of the data blocks is changed, so that, for example, $D_1$ is replaced with $D_1'$, then the parity code is updated to the new value P':

$$P' = D_0 + D_1' + D_2 + \ldots + D_{n-1}.$$

To make this change, a partial parity code may be calculated and applied to the old parity code P to generate the new parity code P'. The partial parity code is a value that when evaluated with the old parity code (e.g., when combined, using a suitable function (e.g., exclusive OR), with the old parity code), yields the new parity code. Conceptually, the partial parity code may be considered to be a value that has the effects of (i) removing, from the parity code, the contribution of the old data and (ii) adding, to the parity code, the contribution of the new data. This notion may be written symbolically as follows:

$$\text{Delta } D_1 = f_{Inverse}(D_1) D_1'$$

where $f_{Inverse}(D_1)$ is a value that when combined, using a suitable function, with the old parity code removes from it the contribution from $D_1$. Once the partial parity code has been calculated, the parity code may be updated as follows:

$$P' = P + \text{Delta } D_1$$

The inverse of the exclusive OR function is the exclusive OR function. As a result, if the parity code is calculated using a bit-wise exclusive OR, then $f_{Inverse}(D_1) = D_1$, and $$\text{Delta } D_1 = D_1 + D_1'.$$

When a write operation is performed, the Ethernet SSD storing the data being modified may (i) when another drive is responsible for updating parity data for the data block being modified, create a parity message (including the partial parity code), and send it to the other drive, or (ii) when it itself is responsible for updating parity data, update the parity data.

Figure 4:
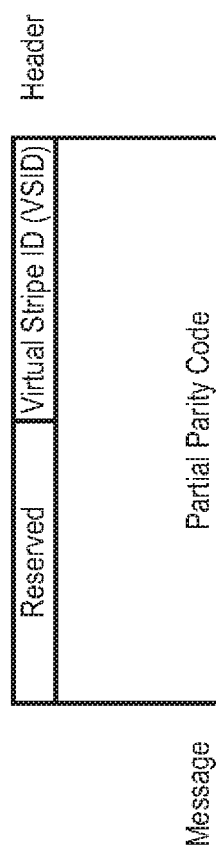
FIG. 4 is a schematic diagram of a parity message, according to an embodiment of the present invention.

FIG. 4 shows an example of a parity message. The parity message includes a header including the virtual stripe identifier (VSID) (i.e., the stripe number) and the partial parity code. Ethernet SSDs may send parity messages to each other through a private communication channel through the PCIe switch or through the Ethernet switch (FIG. 1).

The baseboard management controller may initialize each Ethernet SSD in the storage system at startup. Table 1 below shows the format of a protection configuration table that the baseboard management controller may write to each of the Ethernet SSDs during initialization. Table 1 shows various values that each field may take; further tables below show examples of the values the baseboard management controller may write to the table.

TABLE 1

PROTECTION_CONFIG_TABLE

| Parameter | Value | Comments |
|---|---|---|
| Mode | RAID-4 RAID-5 RAID-6 Erasure Codes (EC) | |
| Parity Code# | 1 to j | Number of parity codes to compute and store |
| Parity Code IDs | Bit vector [0: j − 1] | List of parity code/functions enabled |
| Parity Location | Fixed Rotating | Dedicated parity storage (P eSSDs) Distributed Parity storage (D/P eSSDs) |
| Stride | 0 to n | Number of eSSDs participating in Virtual Stripe |
| Virtual Stripe# | 1 to m | Uniform eSSD user Capacity to advertise |
| Block Size (bytes) | 512, 4K, 8K, 16K | +8, and +16 variations are possible |
| Slot ID | 0 to n − 1 | |

Figure 5:
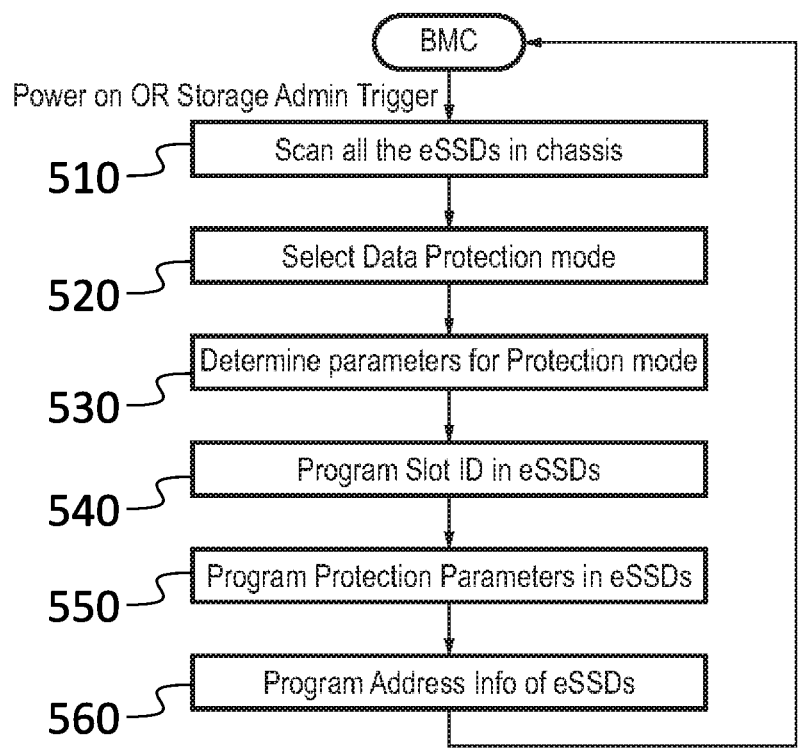
FIG. 5 is a flowchart of an initialization process, according to an embodiment of the present invention.

FIG. 5 is a flowchart of an initialization process, according to an embodiment. At startup, the baseboard management controller may, in an act 510, scan all of the Ethernet SSDs in the Ethernet SSD chassis 110, select, in an act 520, the data protection mode, determine, in an act 530, the parameters for the protection mode, program, in an act 540, the respective slot identifier (ID) (or slot number) into each Ethernet SSD, program, in an act 550, protection parameters into each Ethernet SSD, and, in an act 560, program address information into each Ethernet SSD. The address information may be stored in an Ethernet SSD address table in the Ethernet SSD and may include the information of Table 2 below (with suitable addresses inserted into each of the empty cells).

TABLE 2 eSSD_ADDRESS_TABLE

| Slot ID | Ethernet Address | PCIe Address | Any other Transport fields necessary |
|---|---|---|---|
| 0 | | | |
| 1 | | | |
| 2 | | | |
| n − 1 | | | |

Figure 6:
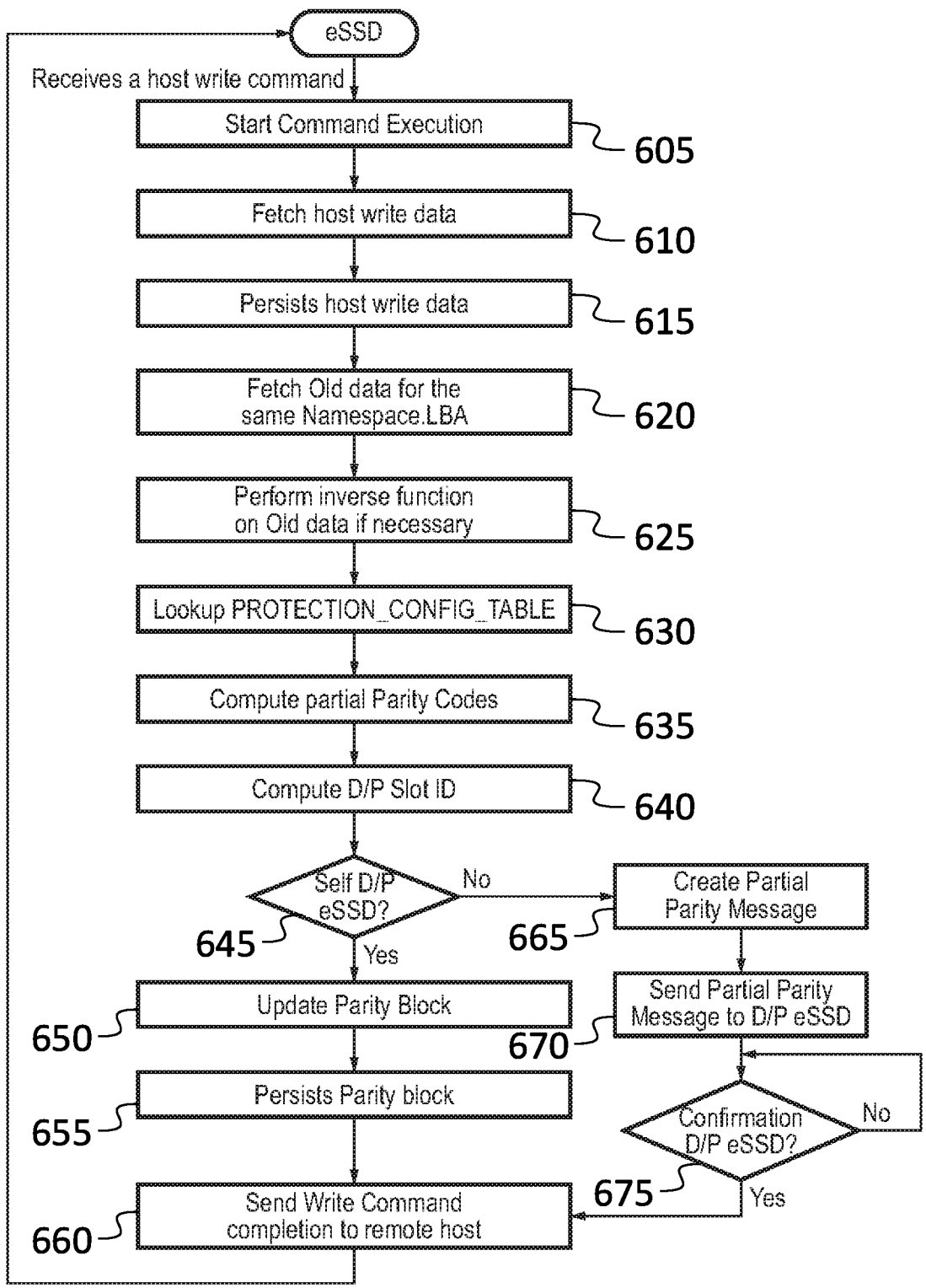
FIG. 6 is a flowchart of a data write operation, according to an embodiment of the present invention.

A data write operation may proceed as illustrated in the flowchart of FIG. 6. Command execution starts in an act 605, and the Ethernet SSD fetches host write data in an act 610, and persists the host write data in an act 615. As used herein, to "persist" data means to save the data in nonvolatile or power-loss-protected memory. The Ethernet SSD then, in an act 620, fetches the old data from the same namespace logical block address, performs, if necessary, in an act 625, an inverse function on the old data, looks up, in an act 630, in the protection configuration table, parameters used to calculate (or "compute") the partial parity code (or codes), computes, in an act 635, the partial parity code (or codes), and computes the slot identifier of the D/P Ethernet SSD in an act 640. The Ethernet SSD then determines, in an act 645, whether it is itself the D/P Ethernet SSD. If it is, it updates, in an act 650, the parity block, persists, in an act 655, the parity block, and, in an act 660, sends a write command completion to the host. If the Ethernet SSD executing the write command is not itself the D/P Ethernet SSD, then, in an act 665, it creates a partial parity message, in an act 670, it sends the partial parity message to the D/P Ethernet SSD, it waits, in an act 675, for confirmation from the D/P Ethernet SSD, and in the act 660, sends a write command completion to the host. In this embodiment, the efficiency of the fetching of old parity codes may be improved, as the D/P Ethernet SSD may be able to maintain some of parity codes in a cache. In the case of fixed parity, the D/P Ethernet SSD may send the updated parity block to the parity plane Ethernet SSD for storage. In some embodiments with fixed parity, each Ethernet SSD may perform the functions of the D/P Ethernet SSD for any data write operation that it performs (i.e., there may be no dedicated D/P Ethernet SSD responsible for the virtual stripe). In such an embodiment, the Ethernet SSD performing the data write operation may compute the partial parity code, fetch the old parity block from the parity plane Ethernet SSD, update the parity block, and send the updated parity block to the parity plane Ethernet SSD for storage.

Figure 7:
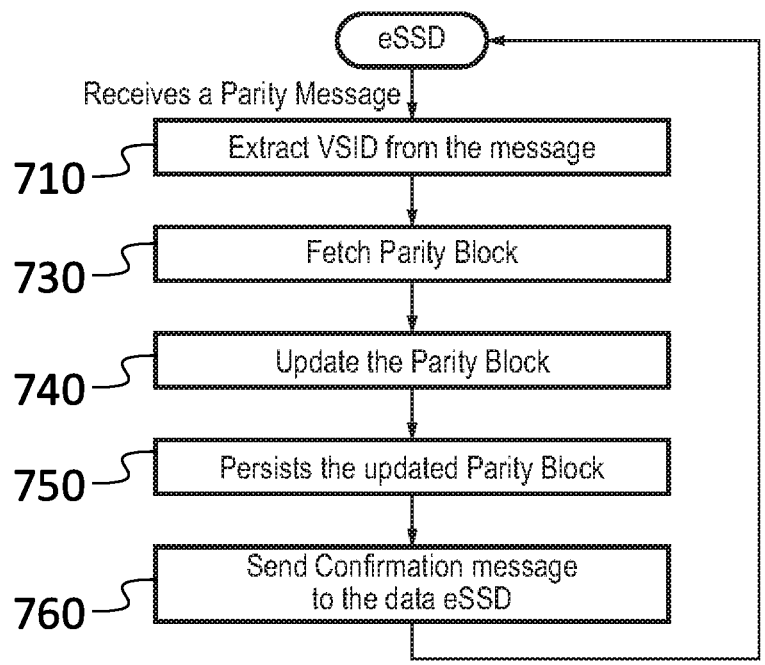
FIG. 7 is a flowchart of a parity update operation, according to an embodiment of the present invention.

A parity update operation may be performed by the D/P Ethernet SSD and proceed as illustrated in FIG. 7. In an act 710, the D/P Ethernet SSD extracts the virtual stripe identifier from the received parity message. Then, in an act 730, it fetches the parity block, in an act 740, it updates the parity block, in an act 750, it persists the updated parity block, and, in an act 760, it sends a confirmation message to the Ethernet SSD executing the write command.

Figure 8:
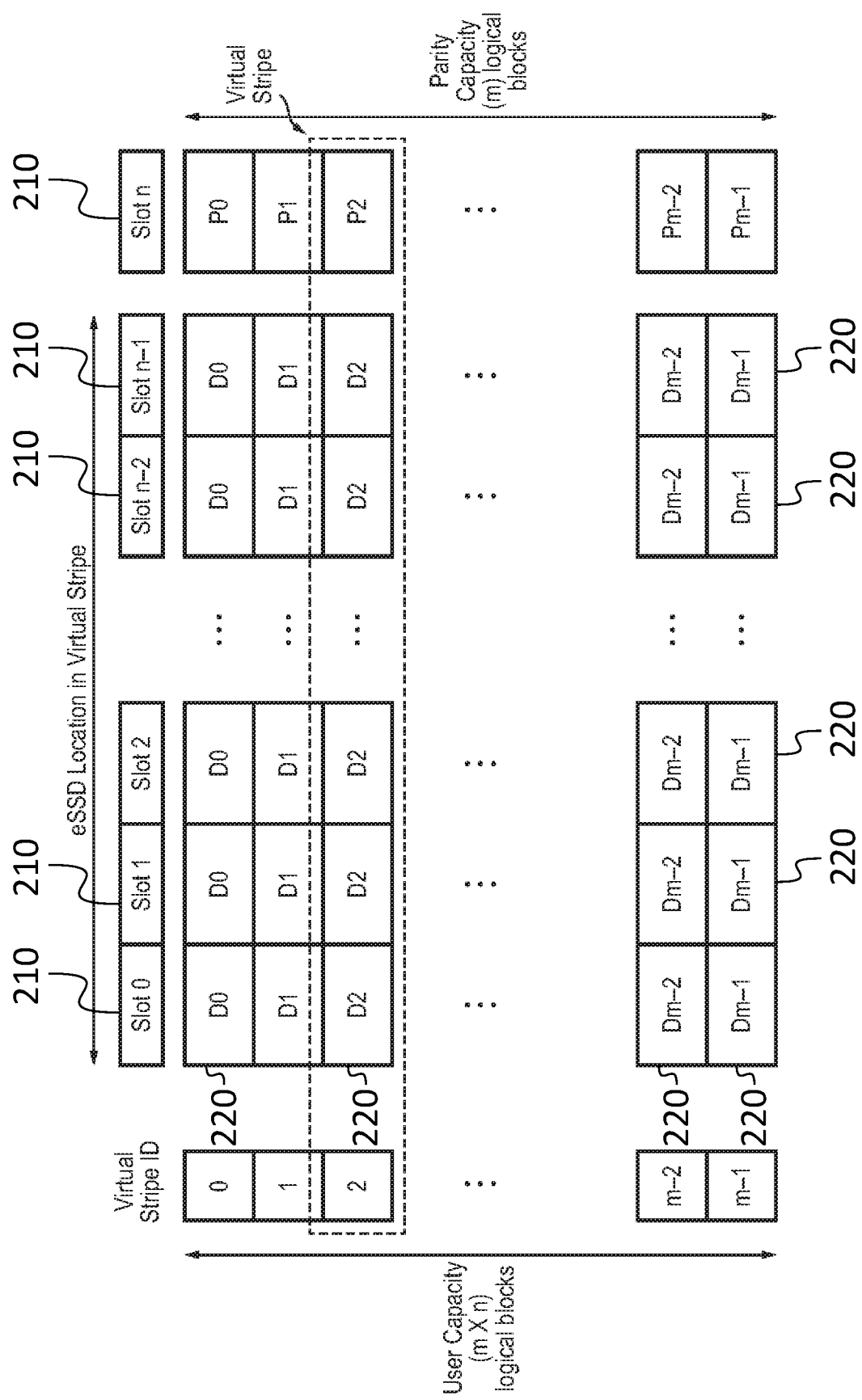
FIG. 8 is a data and parity layout diagram for RAID 4, according to an embodiment of the present invention.

In some embodiments, RAID 4 may be implemented as shown in FIG. 8. RAID 4 may use fixed parity as shown. Table 3 below shows the values that may be programmed into the protection configuration table of each Ethernet SSD by the baseboard management controller to implement RAID 4. Table 3 also shows an exemplary value that may be programmed into the Ethernet SSD address table.

TABLE 3

| PROTECTION_CONFIG_TABLE | |
|---|---|
| Parameter | Value |
| Mode | RAID-4 |
| Parity Code# | 1 |
| Parity Code IDs | 0001 |
| Parity Location | Fixed |
| Stride | n |
| Virtual Stripe# | m |
| Block Size | 512B |
| Slot ID | 0 |

| eSSD_ADDRESS_TABLE | | | |
|---|---|---|---|
| Slot ID | Ethernet Address | PCIe Address | Any other Transport fields |
| 0 | 0x12345678 | | |
| 1 | 0x23456781 | | |
| n − 1 | 0x34567812 | | |
| n | 0x12345678 | | |

Figure 9:
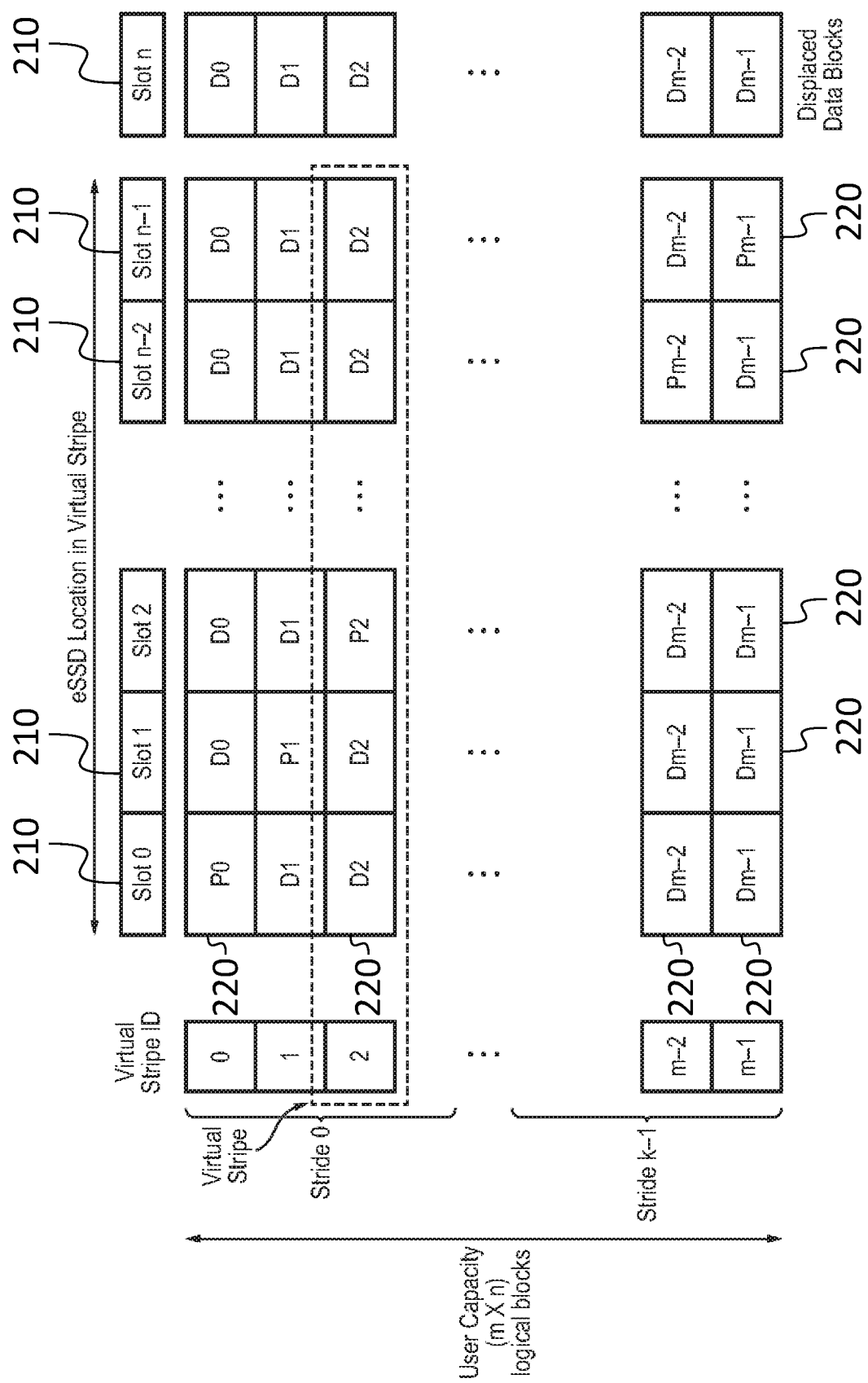
FIG. 9 is a data and parity layout diagram for RAID 5, according to an embodiment of the present invention.

In some embodiments, RAID 5 may be implemented as shown in FIG. 9. RAID 5 may use rotating parity as shown. Table 4 below shows the values that may be programmed into the protection configuration table of each Ethernet SSD by the baseboard management controller to implement RAID 5. Table 4 also shows exemplary values that may be programmed into the Ethernet SSD address table, providing the Ethernet addresses of the other Ethernet SSDs in the storage system. Each Ethernet SSD may use this information, for example, when arranging for the parity codes to be updated when executing a write command.

TABLE 4

| PROTECTION_CONFIG_TABLE | |
|---|---|
| Parameter | Value |
| Mode | RAID-5 |
| Parity Code# | 1 |
| Parity Code IDs | 0001 |
| Parity Location | Distributed |
| Stride | N |
| Virtual Stripe# | M |
| Block Size | 512B |
| Slot ID | 0 |

| eSSD_ADDRESS_TABLE | | | |
|---|---|---|---|
| Slot ID | Ethernet Address | PCIe Address | Any other Transport fields |
| 0 | 0x12345678 | | |
| 1 | 0x23456781 | | |
| n − 1 | 0x34567812 | | |
| n | 0x45678901 | | |

Figure 10:
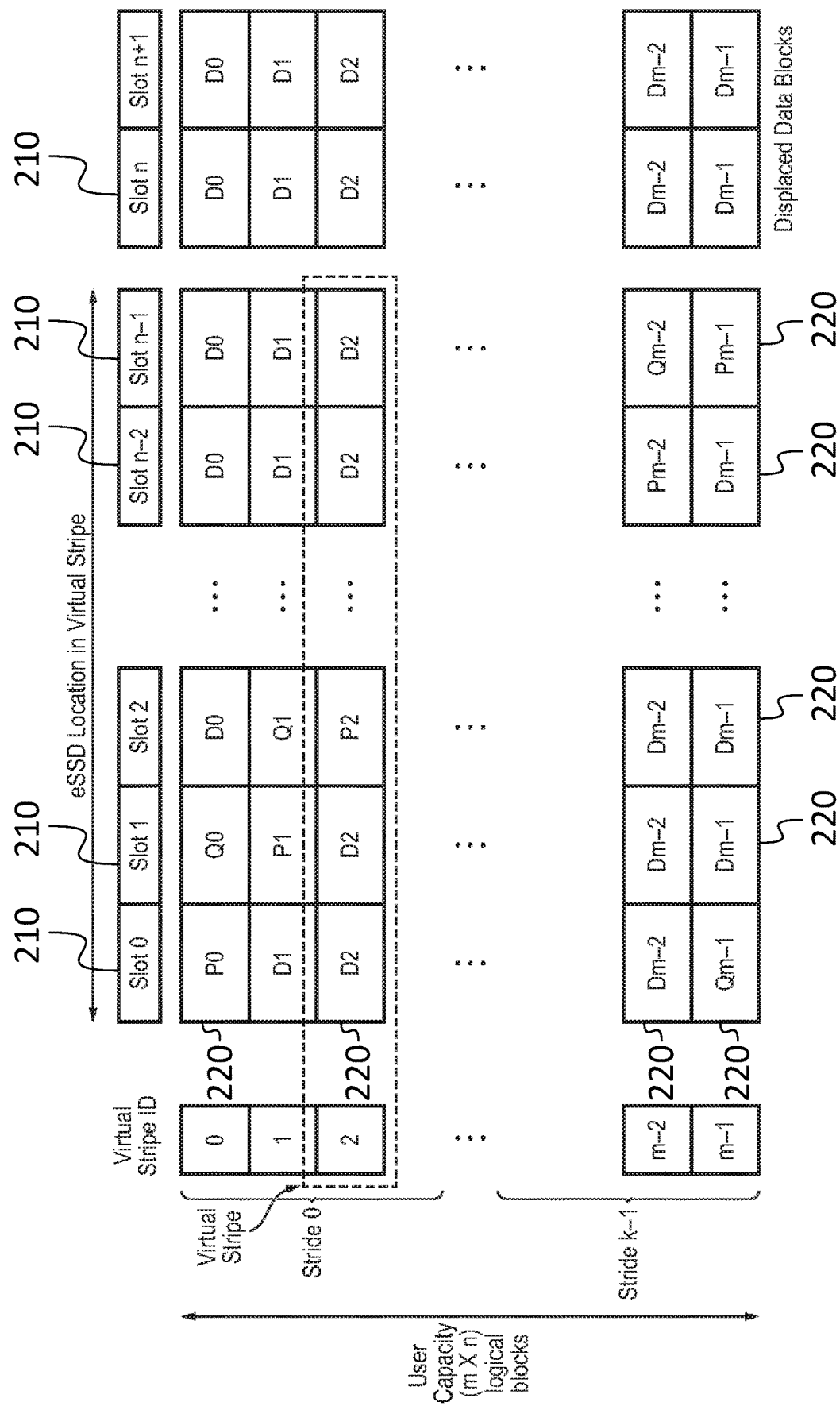
FIG. 10 is a data and parity layout diagram for RAID 6, according to an embodiment of the present invention.

In some embodiments, RAID 6 may be implemented as shown in FIG. 10. RAID 6 may use rotating parity, with two parity blocks per stripe, and with two slots used for the displaced data blocks, as shown. Table 5 below shows the values that may be programmed into the protection configuration table of each Ethernet SSD by the baseboard management controller to implement RAID 6. Table 5 also shows exemplary values that may be programmed into the Ethernet SSD address table, providing the Ethernet addresses of the other Ethernet SSDs in the storage system.

TABLE 5

| PROTECTION_CONFIG_TABLE | |
|---|---|
| Parameter | Value |
| Mode | RAID-6 |
| Parity Code# | 2 |
| Parity Code IDs | 0011 |
| Parity Location | Distributed |
| Stride | N |
| Virtual Stripe# | M |
| Block Size | 512B |
| Slot ID | 0 |

| eSSD_ADDRESS_TABLE | | | |
|---|---|---|---|
| Slot ID | Ethernet Address | PCIe Address | Any other Transport fields |
| 0 | 0x12345678 | | |
| 1 | 0x23456781 | | |
| n − 1 | 0x34567812 | | |
| n | 0x45678901 | | |
| n + 1 | 0x56789012 | | |

Figure 11:
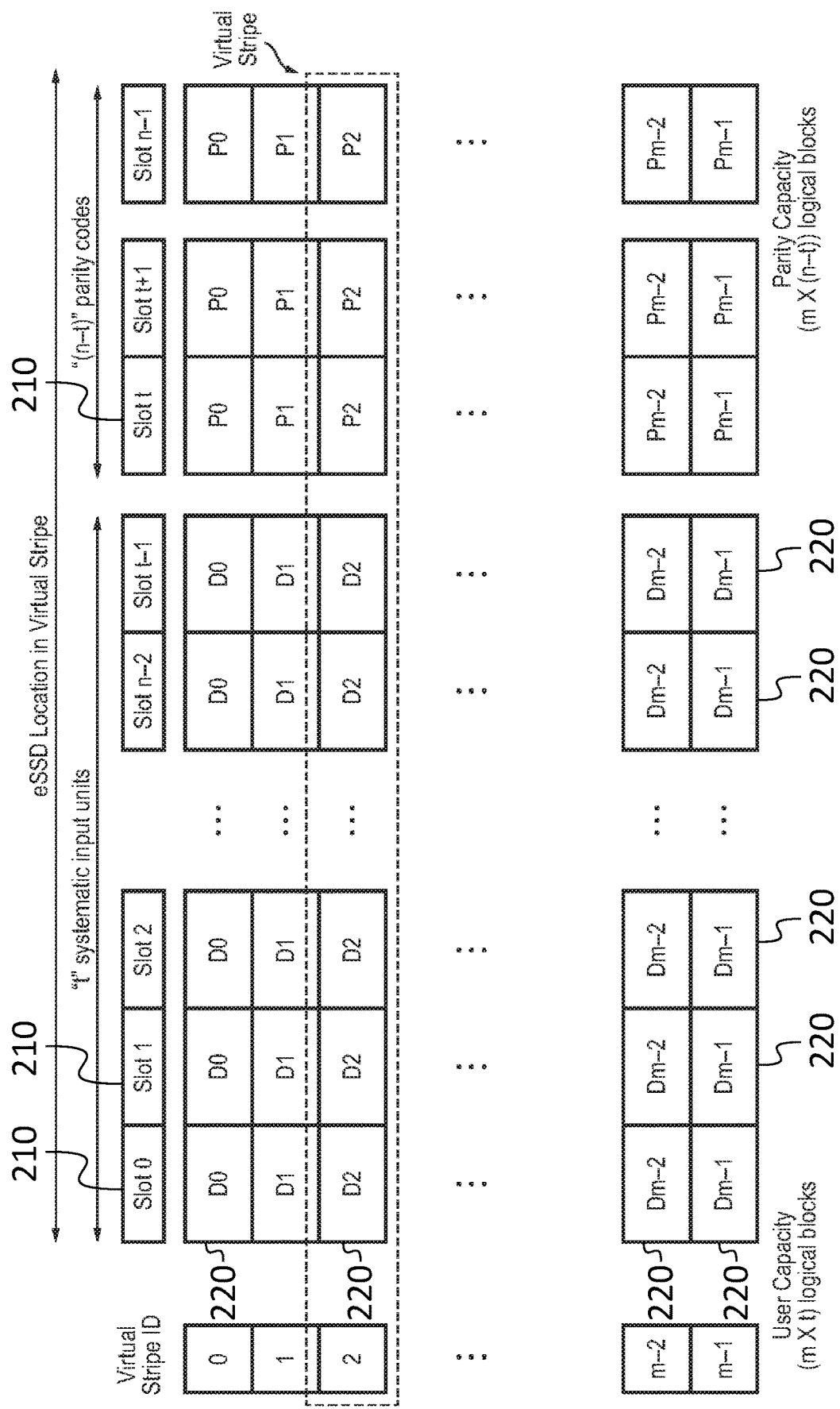
FIG. 11 is a data and parity layout diagram for erasure code data protection, according to an embodiment of the present invention.

In some embodiments, erasure code data protection may be implemented as shown in FIG. 11. Erasure code data protection may use fixed parity, with t systematic input units and n-t parity code blocks per stripe, as shown. Table 6 below shows the values that may be programmed into the protection configuration table of each Ethernet SSD by the baseboard management controller to implement erasure code data protection. Table 6 also shows exemplary values that may be programmed into the Ethernet SSD address table, providing the Ethernet addresses of the other Ethernet SSDs in the storage system.

TABLE 6

| PROTECTION_CONFIG_TABLE | |
| --- | --- |
| Parameter | Value |
| Mode | ERASURE CODING |
| Parity Code# | 3 |
| Parity Code IDs | 00111 |
| Parity Location | Fixed |
| Stride | 8 |
| Virtual Stripe# | M |
| Block Size | 512 |
| Slot ID | 0 |

| eSSD_ADDRESS_TABLE | | | |
| --- | --- | --- | --- |
| Slot ID | Ethernet Address | PCIe Address | Any other Transport fields |
| 0 | 0x12345678 | | |
| 1 | 0x23456781 | | |
| 10 | 0x34567812 | | |

Figure 12:
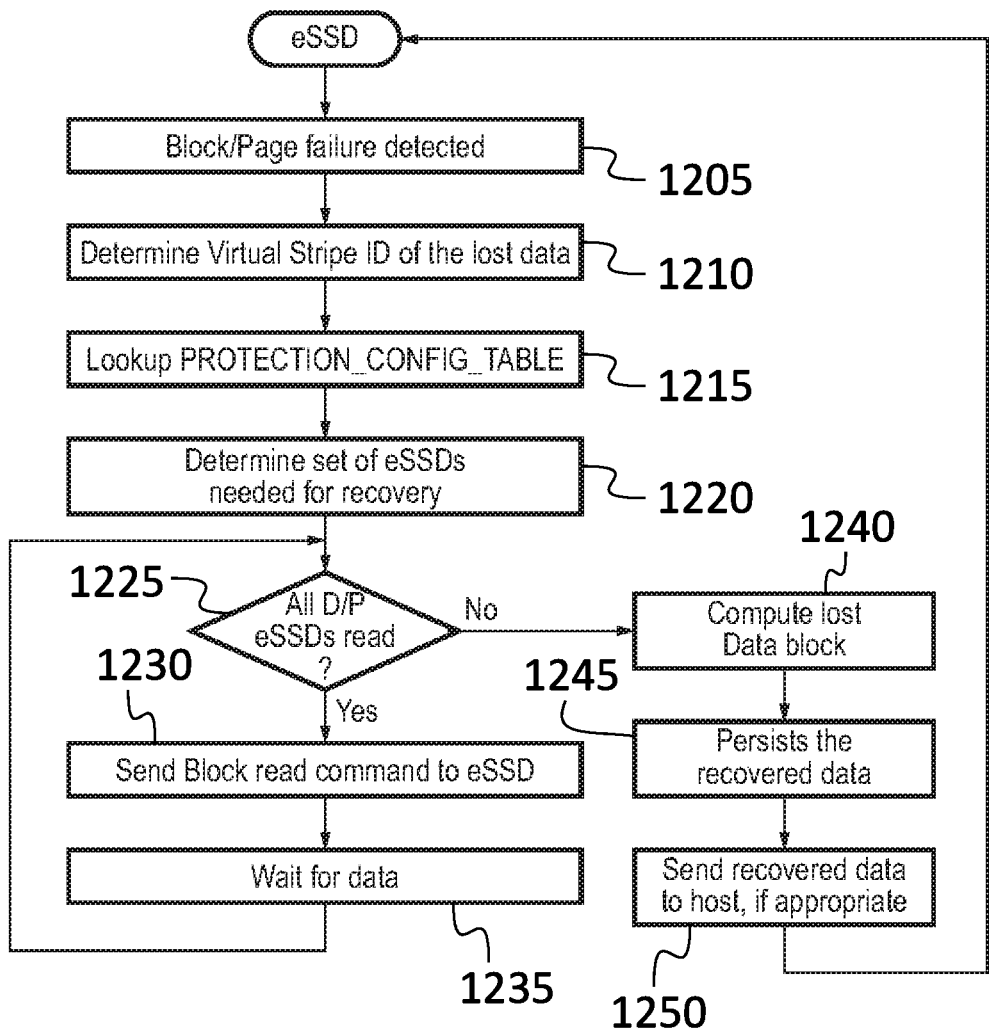
FIG. 12 is a flowchart of a failure recovery operation, according to an embodiment of the present invention.

FIG. 12 shows a flowchart of a method for recovering from discrete failures, in some embodiments. As used herein, a "discrete failure" is a failure in an Ethernet SSD that allows the Ethernet SSD to continue operating but that prevents the Ethernet SSD from successfully reading some of the data it stores. Discrete errors may result from failure of a flash memory page or block or from memory errors that are uncorrectable by a low-density parity-check (LDPC) error correction code that may be employed by the flash memory. In an act 1205, the Ethernet SSD detects a failure, and, in an act 1210, it determines the virtual stripe ID of the lost data. Then, in an act 1215, it retrieves the parameters for data restoration from the protection configuration table, and, in an act 1220, determines the set of Ethernet SSDs needed to recover the lost data. It then, in acts 1225, 1230, and 1235 repeatedly requests data from these Ethernet SSDs, until the data needed to recover the lost data have all been retrieved. Then, in an act 1240, it computes the lost data block, in an act 1245, it persists the lost data block, and, in an act 1250, it sends the lost data to the host, if appropriate. In other embodiments, error recovery is instead performed by the baseboard management controller. In such an embodiment, the Ethernet SSD affected by the failure alerts the baseboard management controller, which requests the data needed to recover the lost data from the virtual stripe, computes the lost data, and writes the recovered data back to the affected Ethernet SSD.

Figure 13:
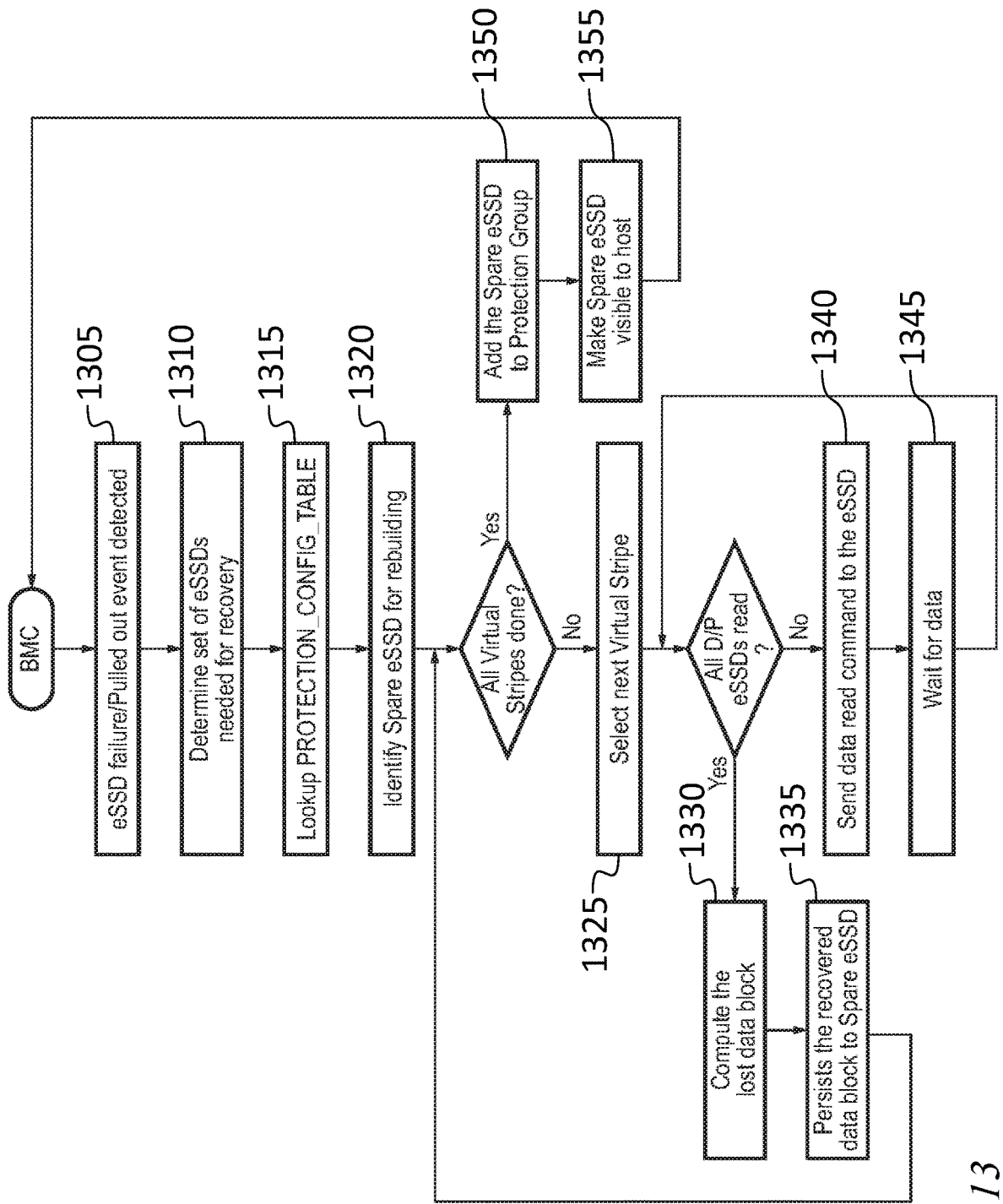
FIG. 13 is a flowchart of a failure recovery operation, according to an embodiment of the present invention.

FIG. 13 shows a flowchart of a method for recovering from disk failures, in some embodiments. Disk failures may be caused by a central hardware failure in an Ethernet SSD or by surprise removal of an Ethernet SSD. In some embodiments the recovery is performed by the baseboard management controller as illustrated in FIG. 13. Each Ethernet SSD may have a presence pin; removal of the Ethernet SSD may result in loss of contact to the presence pin, alerting the baseboard management controller to the removal of the Ethernet SSD.

In an act 1305, the baseboard management controller detects a failure (or pulled out event), and, in an act 1310, it determines the set of Ethernet SSDs needed to recover the lost data. Then, in an act 1315, it retrieves the parameters for data restoration from the protection configuration table, and, in an act 1320, identifies a spare Ethernet SSD in which to rebuild the lost data. It then rebuilds the data using a process including two nested loops. An outer loop, including acts 1325, 1330, and 1335, is executed until all of the virtual stripes have been restored (i.e., the lost block of each virtual stripe has been restored on the spare Ethernet SSD), and an inner loop, including acts 1340 and 1345, is executed to read the data needed for rebuilding from the respective Ethernet SSDs storing these data. Once the outer loop terminates (and the lost data have been rebuilt), the baseboard management controller adds, in an act 1350, the spare Ethernet SSD to the protection group, and, in an act 1355, makes the newly added Ethernet SSD visible to the host.

During the recovery operation, the baseboard management controller may reprogram the Ethernet switch and act as a proxy for the failed Ethernet SSD, responding to read commands from the host by restoring the requested data as needed, and responding to write commands from the host by (i) writing the data to the spare Ethernet SSD on which the lost data is being restored or (ii) writing to the other Ethernet SSDs data and/or parity codes from which the data in the write command will be restored by the ongoing data recovery process.

In some embodiments the recovery by the baseboard management controller is offloaded to the spare Ethernet SSD. The baseboard management controller replaces a spare Ethernet SSD in place of the failed one, and offloads the disk recovery to the spare Ethernet SSD. The new Ethernet SSD builds all of the virtual stripes of recovered data in the background, and handles any IO operations directed to it.

In light of the foregoing, a system and method for distributed erasure coding is disclosed. In some embodiments, a plurality of storage devices is directly connected to one or more host computers, without an intervening central controller distributing data to the storage devices and providing data protection. Parity codes are stored in one or more dedicated storage devices or distributed over a plurality of the storage devices. When a storage device receives a write command, it calculates a partial parity code, and, if the parity code for the data being written is on another storage device, sends the partial parity code to the other storage device, which updates the parity code using the partial parity code.

Although some embodiments described herein employ Ethernet SSDs as persistent storage devices, it will be understood that other embodiments of the invention may be practiced with other storage devices, such as hard disk drives. Although a virtual stripe is described in some embodiments as consisting of a set of blocks across a plurality of Ethernet SSDs in a protection group, the logical block address of each of the blocks being the same, a virtual stripe may more generally be a set of data distributed across the protection group and including redundant data (e.g., parity codes) for data protection.

The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for distributed erasure coding have been specifically described and illustrated herein, many modifications and variations will be apparent to those skilled in the art. Accordingly, it is to be understood that a system and method for distributed erasure coding constructed according to principles of this invention may be embodied other than as specifically described herein. The invention is also defined in the following claims, and equivalents thereof.

What is claimed is:

1. A method for storing data in an array of storage devices, the method comprising:
   receiving, by a first storage device of the array of storage devices, a write command from a host computer, the write command including write data to be written to the first storage device at a logical block address in the first storage device;
   retrieving by the first storage device, old data stored at the logical block address;
   calculating, by the first storage device, from the old data and the write data, a partial parity code, the partial parity code being a number that:
     when evaluated, together with an old parity code,
       the old parity code being a data protection code for an old virtual stripe of data including the old data and extending across all of the array of storage devices,
     results in a new parity code, the new parity code being a data protection code for a new virtual stripe of data extending across all of the array of storage devices and including the write data instead of the old data;
   evaluating, by a second storage device of the array of storage devices, the old parity code together with the partial parity code, to generate the new parity code;
   storing, by a third storage device of the array of storage devices, the new parity code; and
   storing, by the first storage device, the write data.

2. The method of claim 1, wherein the third storage device is a same storage device as the second storage device.

3. The method of claim 1, further comprising:
   calculating, by the first storage device, an identifier of the second storage device;
   determining whether the identifier of the second storage device is different from an identifier of the first storage device; and
   when the identifier of the second storage device is different from the identifier of the first storage device, sending, to the second storage device, a parity message comprising the partial parity code.

4. The method of claim 3, wherein the write command further includes a namespace identifier, and the calculating of the identifier of the second storage device comprises:
   obtaining a namespace offset from a namespace offset table based on the namespace identifier; and
   calculating a virtual stripe identifier as the sum of the namespace offset and the logical block address.

5. The method of claim 4, wherein the calculating of the identifier of the second storage device comprises:
retrieving, by the first storage device, from a first table in the first storage device, a stride size; and
calculating:
the virtual stripe identifier
modulo
the stride size.

6. The method of claim 5, wherein the sending, to the second storage device, of the parity message comprises:
retrieving, by the first storage device, from a second table in the first storage device, an address of the second storage device; and
sending the parity message to the address of the second storage device.

7. The method of claim 6, wherein:
the first storage device is an Ethernet storage device;
the second storage device is an Ethernet storage device; and
the address of the second storage device is an Ethernet address of the second storage device.

8. The method of claim 6, further comprising storing, by a storage system management circuit, the address of the second storage device in the second table in the first storage device.

9. The method of claim 8, further comprising storing, by the storage system management circuit, the stride size in the first table.

10. The method of claim 6, wherein:
the first storage device is connected to a peripheral component interconnect express switch;
the second storage device is connected to the peripheral component interconnect express switch; and
the address of the second storage device is a peripheral component interconnect express address of the second storage device.

11. The method of claim 1, wherein each of the old parity code and the new parity code is a data protection code utilized in a data protection system selected from the group consisting of RAID 4, RAID 5, RAID 6, and erasure code data protection systems.

12. The method of claim 1, wherein the first storage device is connected to a storage interface switch, the method further comprising, upon failure or disconnection of the first storage device:
reconfiguring, by a storage system management circuit, the storage interface switch to route storage commands addressed to the first storage device to the storage system management circuit; and
sending, in response to a received storage command, by the storage system management circuit, the same command completion, through the storage interface switch, as the first storage device would have sent were it present and operating correctly.

13. The method of claim 12, further comprising:
recovering, by the storage system management circuit, data previously stored on the first storage device; and
storing the recovered data on a fourth storage device.

14. The method of claim 1, wherein the first storage device is connected to a storage interface switch, the method further comprising, upon failure or disconnection of the first storage device:
reconfiguring, by a storage system management circuit, the storage interface switch to route storage commands addressed to the first storage device to a fourth storage device; and
sending, in response to a received storage command, by the fourth storage device, the same command completion, through the storage interface switch, as the first storage device would have sent were it present and operating correctly.

15. The method of claim 1, wherein the first storage device is connected to a storage interface switch, the method further comprising, upon occurrence of a discrete failure in the first storage device and receipt of a read command:
recovering data affected by the discrete failure, by the first storage device; and
sending, in response to the read command, by the first storage device, the same command completion, through the storage interface switch, as the first storage device would have sent had the discrete failure not occurred.

16. The method of claim 1, wherein the first storage device is connected to a storage interface switch, the method further comprising, upon occurrence of a discrete failure in the first storage device and receipt of a read command:
recovering data affected by the discrete failure, by a storage system management circuit; and
sending, in response to the read command, by the storage system management circuit, the same command completion, through the storage interface switch, as the first storage device would have sent had the discrete failure not occurred.

17. A system for storing data, comprising an array of storage devices, the system being configured to:
receive, by a first storage device of the array of storage devices, a write command from a host computer, the write command including write data to be written to the first storage device at a logical block address in the first storage device;
retrieve by the first storage device, old data stored at the logical block address;
calculate, by the first storage device, from the old data and the write data, a partial parity code, the partial parity code being a number that:
when evaluated, together with an old parity code,
the old parity code being a data protection code for an old virtual stripe of data including the old data and extending across all of the array of storage devices,
results in a new parity code, the new parity code being a data protection code for a new virtual stripe of data extending across all of the array of storage devices and including the write data instead of the old data;
evaluate, by a second storage device of the array of storage devices, the old parity code together with the partial parity code, to generate the new parity code;
store, by a third storage device of the array of storage devices, the new parity code; and
store, by the first storage device, the write data.

18. The system of claim 17, wherein the third storage device is a same storage device as the second storage device.

19. The system of claim 17, further configured to:
calculate, by the first storage device, an identifier of the second storage device;
determine whether the identifier of the second storage device is different from an identifier of the first storage device; and
when the identifier of the second storage device is different from the identifier of the first storage device, sending, to the second storage device, a parity message comprising the partial parity code.

20. The system of claim 19, wherein the calculating of the identifier of the second storage device comprises:
retrieving, by the first storage device, from a first table in the first storage device, a stride size; and
calculating:
the logical block address
modulo
the stride size.

21. The system of claim 19, wherein the sending, to the second storage device, of the parity message comprises:
retrieving, by the first storage device, from a second table in the first storage device, an address of the second storage device; and
sending the parity message to the address of the second storage device.

22. The system of claim 21, wherein:
the first storage device is an Ethernet storage device;
the second storage device is an Ethernet storage device; and
the address of the second storage device is an Ethernet address of the second storage device.

23. The system of claim 21, further comprising a storage system management circuit configured to store the address of the second storage device in the second table in the first storage device.

24. The system of claim 21, wherein:
the first storage device is connected to a peripheral component interconnect express switch;
the second storage device is connected to the peripheral component interconnect express switch; and
the address of the second storage device is a peripheral component interconnect express address of the second storage device.

25. The system of claim 17, wherein each of the old parity code and the new parity code is a data protection code utilized in a data protection system selected from the group consisting of RAID 4, RAID 5, RAID 6, and erasure code data protection systems.

26. A system for storing data, comprising:
an array of storage devices; and
storage system management means,
the system being configured to:
receive, by a first storage device of the array of storage devices, a write command from a host computer, the write command including write data to be written to the first storage device at a logical block address in the first storage device;
retrieve by the first storage device, old data stored at the logical block address;
calculate, by the first storage device, from the old data and the write data, a partial parity code, the partial parity code being a number that:
when evaluated, together with an old parity code,
the old parity code being a data protection code for an old virtual stripe of data including the old data and extending across all of the array of storage devices,
results in a new parity code, the new parity code being a data protection code for a new virtual stripe of data extending across all of the array of storage devices and including the write data instead of the old data;
evaluate, by a second storage device of the array of storage devices, the old parity code together with the partial parity code, to generate the new parity code;
store, by a third storage device of the array of storage devices, the new parity code; and
store, by the first storage device, the write data.

27. The system of claim 26, wherein the storage system management means is configured to store, in each of the storage devices, an address of another storage device.

* * * * *